(12) United States Patent
Otsuka et al.

(10) Patent No.: US 11,526,128 B2
(45) Date of Patent: Dec. 13, 2022

(54) IMAGE FORMING APPARATUS HAVING DUCT WITH FLOW DIVIDING PLATES

(71) Applicant: CANON KABUSHIKI KAISHA, Tokyo (JP)

(72) Inventors: Yuya Otsuka, Chiba (JP); Hiroki Sato, Ibaraki (JP); Ryuichi Kojima, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/665,288

(22) Filed: Feb. 4, 2022

(65) Prior Publication Data
US 2022/0276606 A1 Sep. 1, 2022

(30) Foreign Application Priority Data
Feb. 26, 2021 (JP) ............................. JP2021-029633

(51) Int. Cl.
| | | |
|---|---|---|
| *G03G 21/00* | (2006.01) | |
| *H02B 1/00* | (2006.01) | |
| *H05K 7/00* | (2006.01) | |
| *F24F 13/00* | (2006.01) | |
| *G03G 21/20* | (2006.01) | |
| *H05K 7/20* | (2006.01) | |

(Continued)

(52) U.S. Cl.
CPC ............ *G03G 21/206* (2013.01); *F24F 13/08* (2013.01); *G03G 15/0258* (2013.01); *H02B 1/56* (2013.01); *H05K 7/20145* (2013.01); *G03G 2221/1645* (2013.01)

(58) Field of Classification Search
CPC ............. G03G 15/0258; G03G 21/206; G03G 2221/1645; H02B 1/56; H05K 7/20145; H05K 7/20181; F24F 7/06; F24F 13/08; F24F 13/081

USPC .... 399/92, 93, 100; 454/184, 251, 279, 338; 165/100, 102, DIG. 312, DIG. 522; 312/236; 361/678, 679.49, 679.5, 679.51, 361/690, 695, FOR. 110
See application file for complete search history.

(56) References Cited

U.S. PATENT DOCUMENTS

| | | | | |
|---|---|---|---|---|
| 4,745,282 A | * | 5/1988 | Tagawa | .................. H01T 19/00 |
| | | | | 250/326 |
| 5,531,484 A | * | 7/1996 | Kawano | .................. F16L 43/00 |
| | | | | 285/179.2 |

(Continued)

FOREIGN PATENT DOCUMENTS

| | | | | |
|---|---|---|---|---|
| EP | 2916176 A1 | * | 9/2015 | ......... G03G 15/0867 |
| JP | 2014-191018 | | 10/2014 | |
| JP | 2015172673 A | * | 10/2015 | ............. G03G 15/02 |

*Primary Examiner* — Robert B Beatty
(74) *Attorney, Agent, or Firm* — Venable LLP

(57) ABSTRACT

A duct for guiding air outside an image forming apparatus to a charging device includes: a first flow passage; a second flow passage bent from the first flow passage and extending in a direction orthogonal to a rotational direction and a rotational axis direction of a photosensitive drum, the second flow passage being provided with an outlet; and a plurality of flow dividing plates provided in the second flow passage, the plurality of flow dividing plates being disposed in parallel along the rotational axis direction and forming a third flow passage between the flow dividing plates adjacent to each other, in which a relationship between a length in the orthogonal direction and a length in the rotational axis direction of the third flow passage is a predetermined relationship.

8 Claims, 18 Drawing Sheets

(51) Int. Cl.
*H02B 1/56* (2006.01)
*F24F 13/08* (2006.01)
*G03G 15/02* (2006.01)

(56) References Cited

U.S. PATENT DOCUMENTS

| | | | |
|---|---|---|---|
| 9,228,592 B2 | 1/2016 | Ryuzaki et al. | F04D 29/403 |
| 10,106,312 B2 | 10/2018 | Sato | B65D 81/02 |
| 2006/0045558 A1* | 3/2006 | Nishida | G03G 21/206 |
| | | | 399/93 |
| 2010/0181717 A1* | 7/2010 | Sumikura | G03G 15/6573 |
| | | | 271/226 |
| 2011/0121510 A1* | 5/2011 | Tsuda | G03G 15/0258 |
| | | | 271/226 |
| 2012/0045243 A1* | 2/2012 | Nishikawa | G03G 21/206 |
| | | | 399/92 |
| 2014/0321878 A1* | 10/2014 | Kondo | B41J 2/175 |
| | | | 399/93 |
| 2017/0242397 A1* | 8/2017 | Kudo | G03G 21/206 |
| 2020/0026235 A1* | 1/2020 | Kawatani | G03G 15/2064 |

* cited by examiner

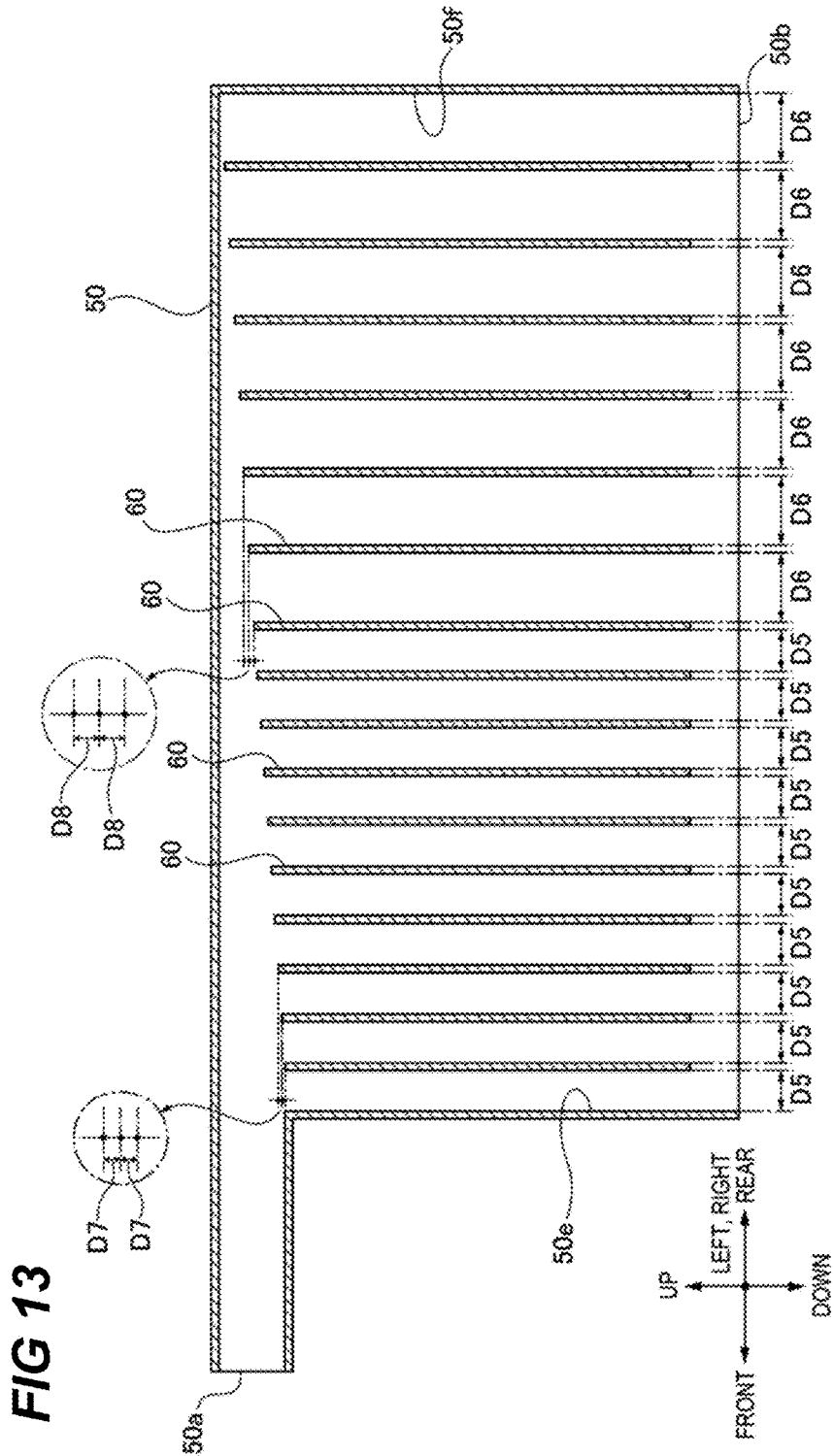

IMAGE FORMING APPARATUS HAVING DUCT WITH FLOW DIVIDING PLATES

BACKGROUND OF THE INVENTION

Field of the Invention

The present invention relates to an image forming apparatus of an electrophotographic system such as an electrophotographic copying machine or an electrophotographic printer.

Description of the Related Art

In an image forming apparatus of an electrophotographic system, for the purpose of removing dust and unnecessary substances, a configuration is widely used in which air outside the image forming apparatus is fed to a predetermined place by using a fan and a duct.

For example, Patent Literature 1 describes a configuration in which air outside an image forming apparatus is fed into a charging device by using a fan and a duct. The configuration suppresses adhesion of discharge products generated by corona discharge to a discharge wire of the charging device and occurrence of charging failure. Japanese Patent Application Laid-Open No. 2014-191018 describes a configuration in which a plurality of flow dividing plates is provided near an outlet of a duct to reduce unevenness in flow velocity of air discharged from the outlet of the duct.

When a plurality of flow dividing plates is provided inside a duct as in the configuration disclosed in Japanese Patent Application Laid-Open No. 2014-191018, air flowing into an air flow passage formed by the flow dividing plates adjacent to each other generates a vortex. As illustrated in FIG. 18, in the case where the length of the flow dividing plate is shorter than the size of the vortex generated in the air flow passage, the backflow component of the vortex comes out of the flow dividing plate, and the air flows backward near the outlet of the air flow passage. Since the flow dividing plate is generally provided near the outlet of the duct, if air flows backward near the outlet of the air flow passage formed by the flow dividing plate, air may flow backward near the outlet of the duct. Thus, if air flows backward near the outlet of the duct, there is a concern that dust and unnecessary substances may flow backward together with the air flowing backward, and the capability of removing dust and unnecessary substances may be reduced.

Therefore, it is desirable for the present invention to provide an image forming apparatus including a duct provided with a plurality of flow dividing plates, the image forming apparatus being capable of suppressing backflow of air near an outlet of the duct.

SUMMARY OF THE INVENTION

An exemplary configuration of an image forming apparatus according to the present invention for achieving the above object is an image forming apparatus including: a duct configured to guide air outside the image forming apparatus to a cooling target; and a fan configured to generate an air flow for taking the air outside the image forming apparatus into the duct, in which the duct includes: a first flow passage; a second flow passage bent from the first flow passage and extending in a first direction, the second flow passage being provided with an outlet of the duct; and a plurality of flow dividing plates provided in the second flow passage, the plurality of flow dividing plates being disposed in parallel along a second direction orthogonal to the first direction and forming a third flow passage between the flow dividing plates adjacent to each other, and when a length in the first direction of the third flow passage is L (mm) and a length in the second direction of the third flow passage is D (mm), the L satisfies following conditions: if $3.0 \leq D \leq 5.5$, $L \geq D \times 3.04 - 6.72$; if $5.5 \leq D \leq 6.5$, $L \geq D \times 4.0 - 12.0$; if $6.5 \leq D \leq 9.0$, $L \geq D \times 8.40 - 40.60$; if $9.0 \leq D \leq 13.0$, $L \geq D \times 10.50 - 59.50$; and if $13.0 \leq D \leq 28.0$, $L \geq D \times 4.70 + 15.90$.

Further features of the present invention will become apparent from the following description of exemplary embodiments with reference to the attached drawings.

BRIEF DESCRIPTION OF THE DRAWINGS

FIG. 13 is a schematic cross-sectional view of the second duct;

DESCRIPTION OF THE EMBODIMENTS

First Embodiment

<Image Forming Apparatus>

First, an entire configuration of an image forming apparatus according to a first embodiment of the present invention will be described below with reference to the drawings together with an operation during image formation. The dimensions, materials, shapes, and relative arrangements of the components described below are not intended to limit the scope of the present invention to only those components, unless otherwise specified.

An image forming apparatus A is an intermediate tandem type image forming apparatus that forms an image by transferring toner of four colors of yellow Y, magenta M, cyan C, and black K to an intermediate transfer belt and then transferring the image to a sheet. In the following description, although Y, M, C, and K are added as subscripts to the members using the toners of the respective colors, since the configurations and operations of the respective members are substantially the same except that the colors of the toners used are different, the subscripts are appropriately omitted unless distinction is necessary.

Figure 1:
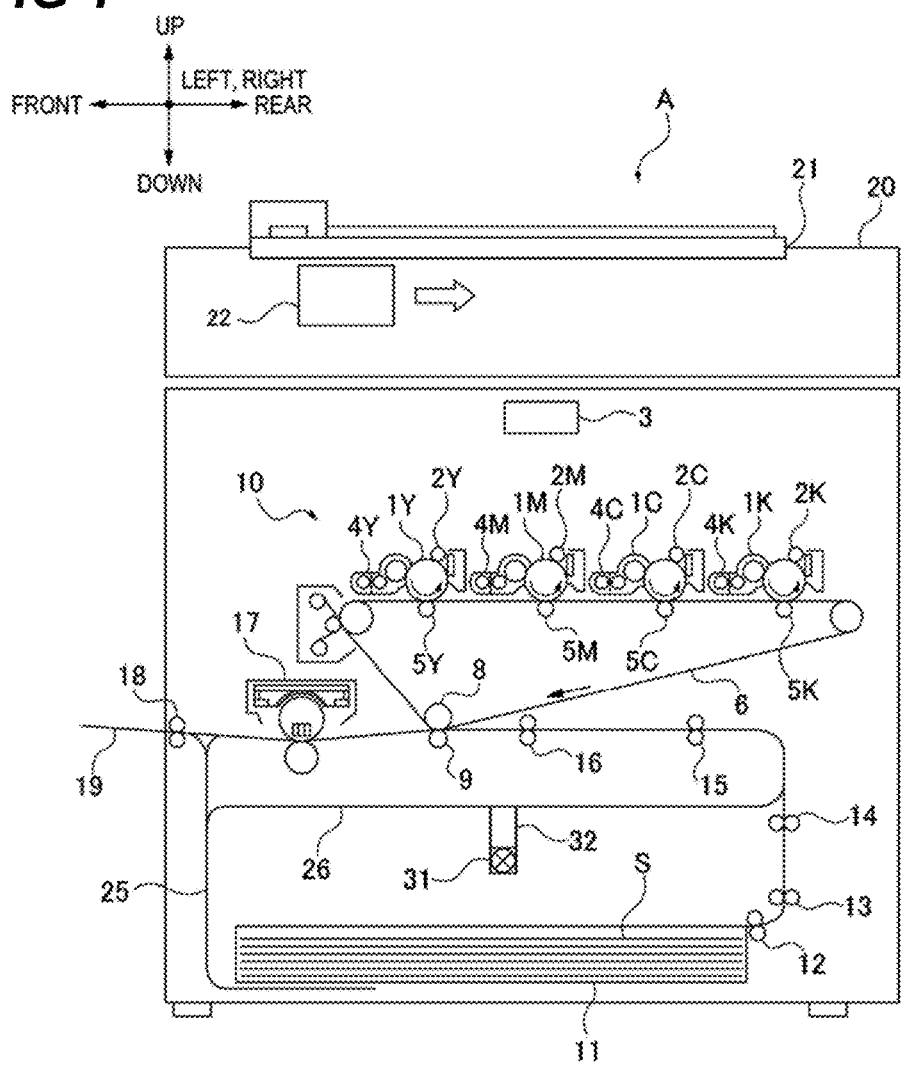
FIG. 1 is a cross-sectional schematic view of an image forming apparatus.

FIG. 1 is a cross-sectional schematic view of the image forming apparatus A. As illustrated in FIG. 1, the image forming apparatus A includes an image forming portion 10 that forms a toner image and transfers the toner image onto a sheet. The image forming portion 10 includes photosensitive drums 1 (1Y, 1M, 1C, and 1K) serving as photoreceptors, charging devices 2 (2Y, 2M, 2C, and 2K) serving as charging members, a laser scanner unit 3, and developing devices 4 (4Y, 4M, 4C, and 4K). The image forming portion also includes a transfer device including primary transfer rollers 5 (5Y, 5M, 5C, and 5K), an intermediate transfer belt 6, a secondary transfer roller 9, and a secondary transfer counter roller 8.

A reader 20 that reads an image of an original is provided above the image forming portion 10.

The reader 20 has an original base plate glass 21 and a scanner unit 22. The scanner unit 22 optically reads an image of an original placed on the original base plate glass 21.

The image forming operation of the image forming apparatus A will then be described. First, when an image forming job signal is input to a controller not illustrated, a sheet S stacked and stored in a sheet cassette 11 is conveyed to a registration roller 16 by a feeding roller 12 and conveying rollers 13, 14, and 15. The registration roller 16 conveys the sheet S to a secondary transfer portion formed by the secondary transfer roller 9 and the secondary transfer counter roller 8 at a predetermined timing.

On the other hand, in the image forming portion 10, the surface of the photosensitive drum 1Y is first charged by the charging device 2Y After the charging, the laser scanner unit 3 irradiates the surfaces of the photosensitive drums 1Y with a laser beam according to the image data of the original read by the reader 20 to form an electrostatic latent image on the surface of the photosensitive drum 1Y. A yellow toner is then adhered to the electrostatic latent image formed on the surface of the photosensitive drum 1Y by the developing device 4Y to form a yellow toner image on the surface of the photosensitive drum 1Y. The toner image formed on the surface of the photosensitive drum 1Y is primarily transferred onto the intermediate transfer belt 6 by applying a bias to the primary transfer roller 5Y.

By a similar process, the surfaces of the photosensitive drums 1M, 1C, and 1K are also irradiated with a laser beam from the laser scanner unit 3 according to an image signal to form toner images of magenta, cyan, and black. A primary transfer bias is applied to the primary transfer rollers 5M, 5C, and 5K, so that these toner images are transferred onto the yellow toner image on the intermediate transfer belt 6 in a superposed manner. Thus, a full-color toner image is formed on the surface of the intermediate transfer belt 6.

After the image formation, the intermediate transfer belt 6 circularly moves to send the full-color toner image to the secondary transfer portion. The full-color toner image on the intermediate transfer belt 6 is transferred onto the sheet S by applying a bias to the secondary transfer roller 9 in the secondary transfer portion.

The sheet S onto which the toner image has been transferred is then subjected to heat and pressure treatment in a fixing device 17, and thus the toner image on the sheet S is fixed to the sheet S. After the fixation, the sheet S on which the toner image is fixed is discharged to a discharge tray 19 by a discharge roller 18.

When images are formed on both sides of the sheet S, the sheet S that has passed through the fixing device 17 is sent to a reverse conveying passage 25 (reverse conveying path). The front and back sides of the sheet S are reversed in a switchback manner in the reverse conveying passage 25. After the reversal, the sheet S passes through a double-sided conveying passage 26 and is sent again to the registration roller 16, and image formation is performed on the back surface of the sheet S in the same manner as described above. The image forming apparatus A of the present embodiment has a conveying device including the reverse conveying passage 25 that conveys a sheet to which a toner image is fixed by the fixing device 17, the double-sided conveying passage 26, and the discharge roller 18. The reverse conveying passage 25 and the double-sided conveying passage 26 are provided with pairs of conveying rollers not illustrated that nip and convey the sheet S. The pairs of conveying rollers are also included in the conveying device.

<Countermeasures Against Dew Condensation in Double-Sided Conveying Passage>

The countermeasures against dew condensation in the double-sided conveying passage 26 will then be described.

Moisture is released from the sheet S heated by the fixing device 17. In a case where the moisture is condensed in the double-sided conveying passage 26, the condensed dew is adhered to the sheet S, and a transfer failure of the toner image, or a failure of conveying the sheet S due to uneven conveying resistance of the sheet S is likely to occur. Therefore, as illustrated in FIG. 1, a first fan 31 and a first duct 32 for taking in air for cooling the sheet S from the outside of the image forming apparatus A and sending the air to the double-sided conveying passage 26 are provided on the front side of the image forming apparatus A and at a position below the double-sided conveying passage 26 in the vertical direction.

Figure 2:
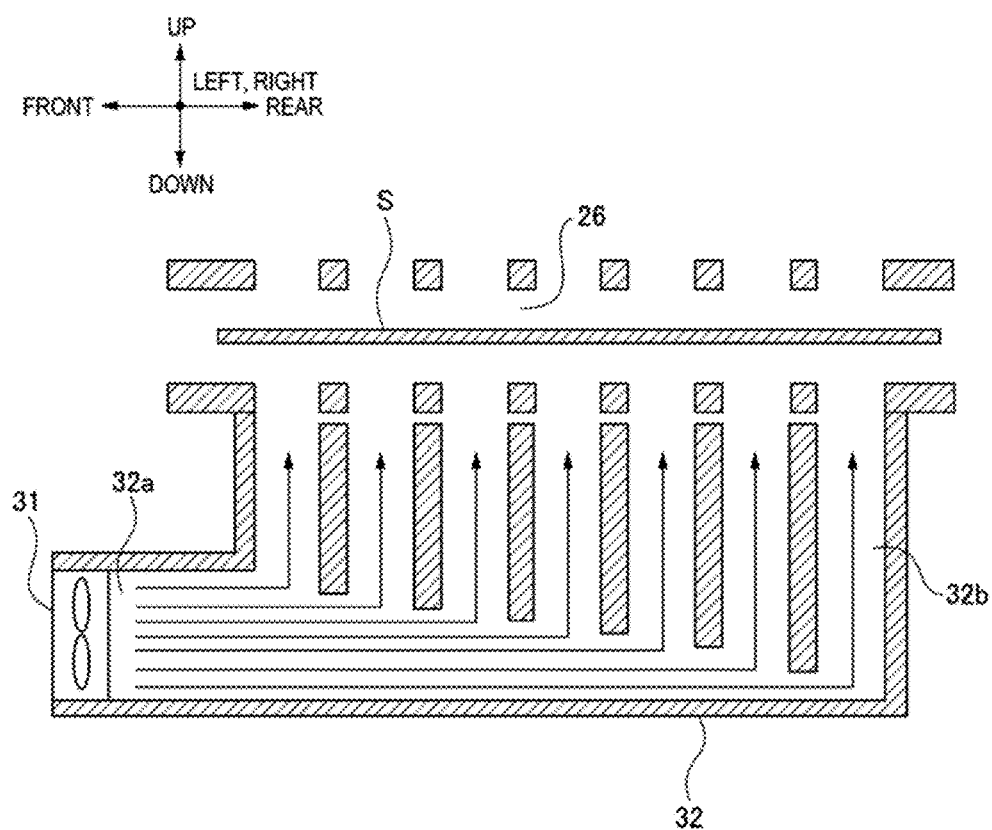
FIG. 2 is a cross-sectional schematic view of a first fan and a first duct.

FIG. 2 is a cross-sectional schematic view of the first fan 31 and the first duct 32. As illustrated in FIG. 2, in order to guide air toward the double-sided conveying passage 26, the first duct 32 has a first flow passage 32a extending from the front to the rear of the image forming apparatus A and a second flow passage 32b vertically bent upward in the vertical direction from the first flow passage 32a. The first fan 31 is provided inside the first duct 32. The first fan 31 generates an airflow for taking in air outside the image forming apparatus A into the first duct 32.

The air taken into the first duct 32 by the airflow generated by the first fan 31 is guided by the first duct 32 in the direction of arrows illustrated in FIG. 2 and fed into the double-sided conveying passage 26. In the double-sided conveying passage 26, air is blown onto the sheet S, which is an example of a cooling target of the present embodiment. Thus, the sheet S heated by the fixing device 17 is cooled and the amount of moisture released from the sheet S is reduced, so that dew condensation in the double-sided conveying passage 26 is suppressed and failure of conveying the sheet S and transfer failure of a toner image are suppressed. The cooling target of the first duct 32 is not limited to the sheet S on the reverse conveying path, and may be any sheet S that has passed through the fixing device 17.

For example, in a modification, a duct may be provided to cool the sheet S on the conveying path between the fixing device 17 and the discharge tray 19.

Countermeasures Against Ozone in Charging Device

The countermeasures against ozone in the charging device 2 will then be described. Although the countermeasures against ozone in one charging device 2 will be described below, all the charging devices 2Y to 2K have the same configuration.

Figure 3:
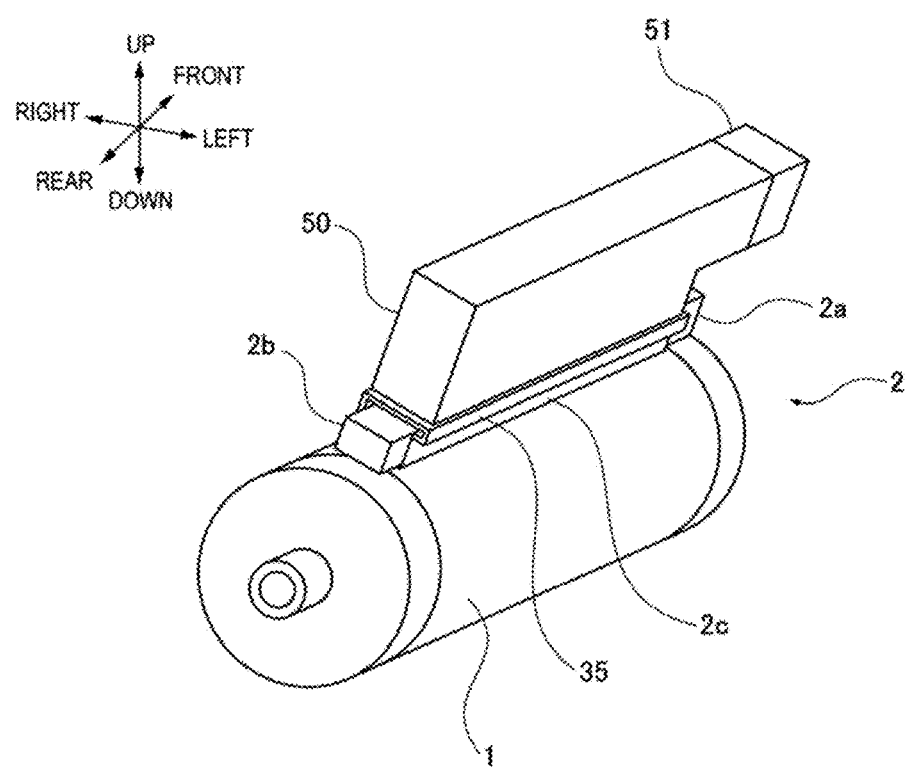
FIG. 3 is a schematic perspective view of a charging device.
Figure 4:
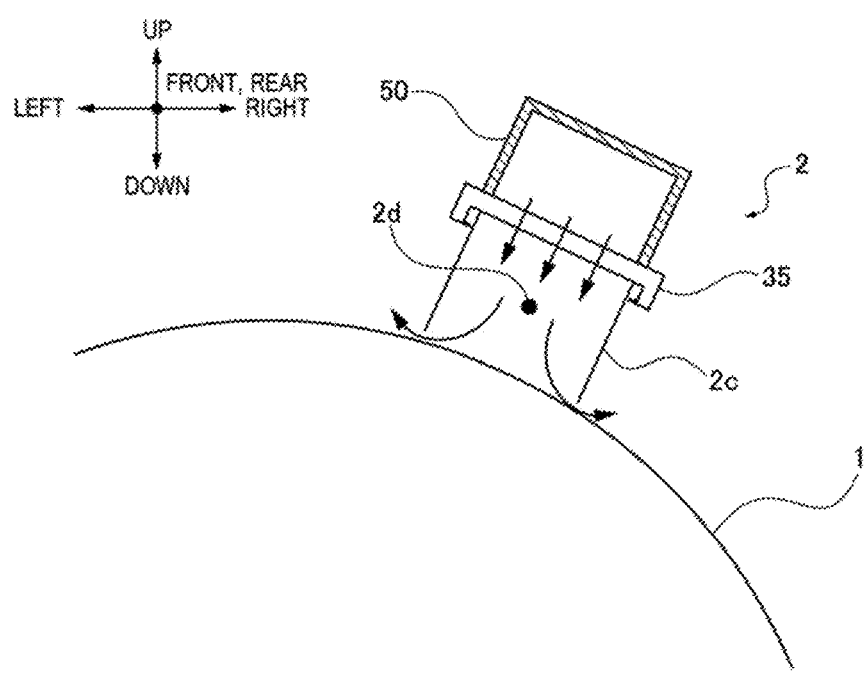
FIG. 4 is a schematic cross-sectional view of the charging device.

FIG. 3 is a schematic perspective view of a charging device 2 that is another example of a cooling target of the present embodiment. FIG. 4 is a schematic cross-sectional view of the charging device 2. As illustrated in FIGS. 3 and 4, the charging device 2 includes a front block 2a and a rear block 2b which are made of an insulator, a shield plate 2c which regulates a charging region on the photosensitive drum 1, and a charging wire 2d. The charging device 2 is configured to be detachably attachable to a charging rail 35 attached to a frame body (not illustrated) of the image forming apparatus A.

The charging wire 2d is stretched by a support member not illustrated at a position between the front block 2a and the rear block 2b, and receives a voltage from a contact portion not illustrated of the rear block 2b. The support member not illustrated is disposed outside the image forming region of the photosensitive drum 1 in the front-rear direction of the image forming apparatus A so as not to prevent charging of the photosensitive drum 1 by the charging wire 2d.

A second duct 50 is provided on the upper surface of the charging rail 35. The second duct 50 is attached with a second fan 51 that generates an airflow for taking air outside the image forming apparatus A into the second duct 50.

As indicated by arrows in FIG. 4, the air taken into the second duct 50 by the airflow generated by the second fan 51 is guided by the second duct 50, passes through the inside of the shield plate 2c of the charging device 2, and is discharged to the outside of the shield plate 2c. At this timing, an ozone product generated by corona discharges around the charging wire 2d is discharged to the outside of the shield plate 2c together with air. The air containing the ozone product discharged to the outside of the shield plate 2c is sucked by a suction unit (e.g., a suction fan) not illustrated, passes through an ozone filter not illustrated to remove the ozone product, and is then discharged to the outside of the image forming apparatus A. Thus, removing the ozone product allows to suppress occurrence of charging failure due to adhesion of the ozone product to the charging wire 2d.

The space surrounded by the front block 2a, the rear block 2b, and the shield plate 2c has a function of guiding the air passing through the inside of the second duct 50 to the photosensitive drum 1. Since the support member (not illustrated) for supporting the charging wire 2d needs to be disposed outside the image forming region of the photosensitive drum 1 as described above, the length of the above space in the front-rear direction of the image forming apparatus A is 10 percent larger than the maximum image forming region of the photosensitive drum 1, and is 350 mm in the present embodiment.

Second Duct

The configuration of the second duct 50 will then be described.

Figure 5:
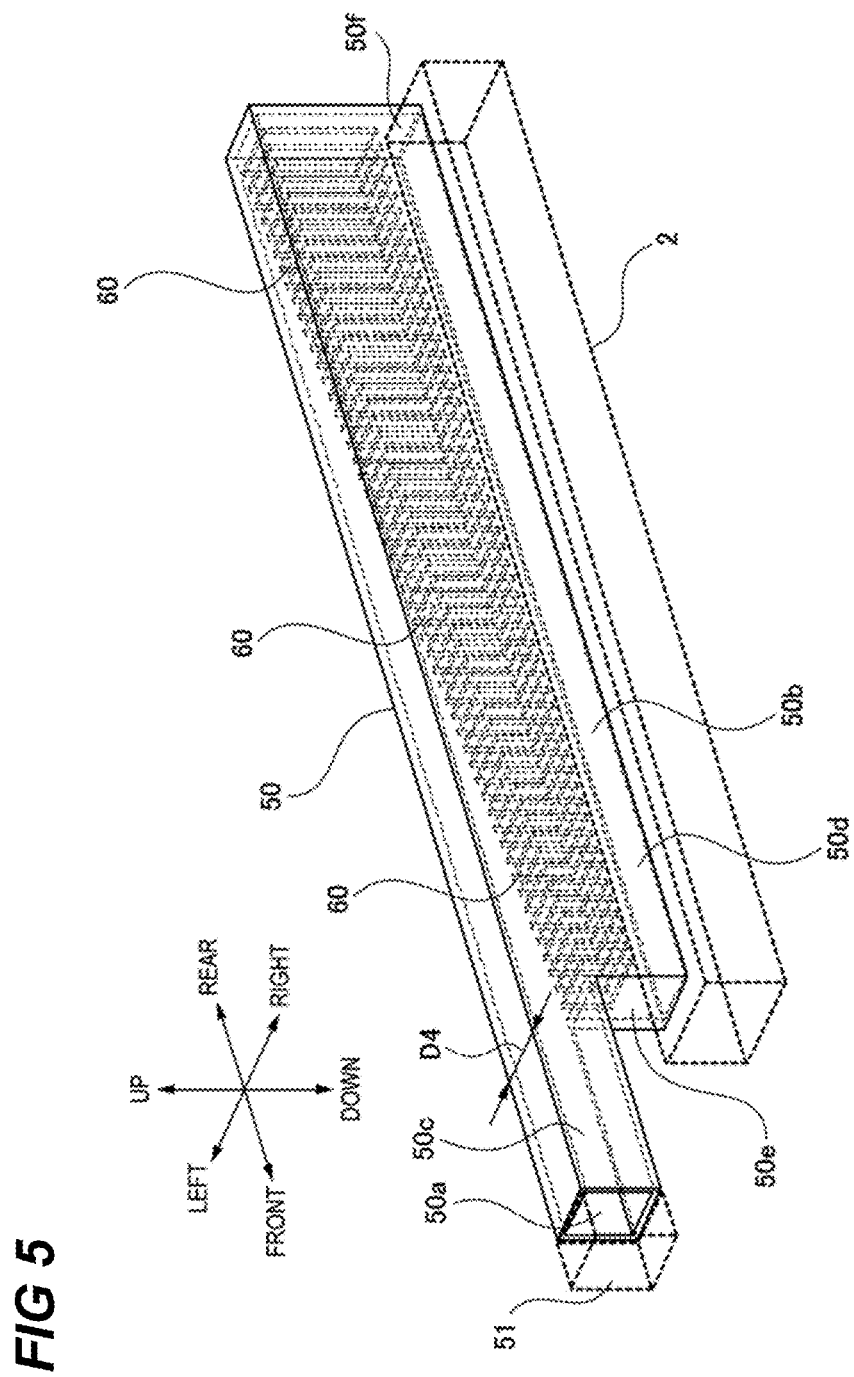
FIG. 5 is a perspective schematic view of a second duct.
Figure 6:
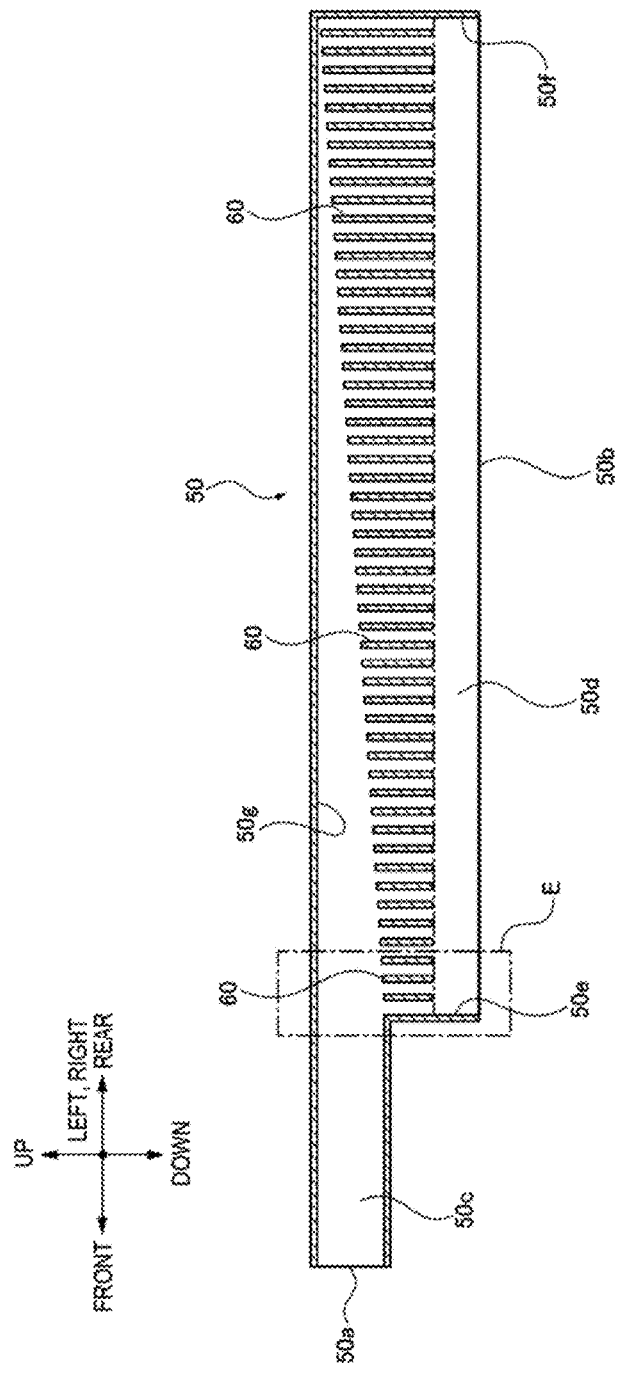
FIG. 6 is a cross-sectional schematic view of the second duct.

FIG. 5 is a perspective schematic view of the second duct 50. FIG. 6 is a cross-sectional schematic view of the second duct 50. As illustrated in FIGS. 5 and 6, an inlet 50a (air intake port) of the second duct 50 is a substantially square opening of 22 mm×23 mm, and is provided in an exterior cover (exterior) not illustrated on the front side of the image forming apparatus A. The inlet 50a of the second duct 50 is attached with the second fan 51 that generates an airflow for taking air outside the image forming apparatus A into the second duct 50. The outlet 50b of the second duct 50 is a rectangular opening of 22 mm×350 mm, and is connected to the charging device 2.

The second duct 50 is disposed above in the vertical direction of the charging device 2. Therefore, in order to guide air toward the charging device 2, the second duct 50 has a first flow passage 50c (first flow path) extending from the front to the rear of the image forming apparatus A and a second flow passage 50d (second flow path) vertically bent downward in the vertical direction from the first flow passage 50c. The air taken into the first flow passage 50c from the inlet 50a of the second duct 50 by the airflow generated by the second fan 51 passes through the inside of the second duct 50, is discharged from the outlet 50b, and is sent to the charging device 2.

In the present embodiment, the front side of the image forming apparatus A is a side on which a user normally stands to operate an operation panel not illustrated for performing settings related to image formation, and the rear side of the image forming apparatus A is the opposite side. The left side of the image forming apparatus A is the left side when viewed from the front side, and the right side is the right side when viewed from the front side. The front-rear direction of the image forming apparatus A and the rotational axis direction of the photosensitive drum 1 are the same direction. The left-right direction of the image forming apparatus A and the rotational direction of the photosensitive drum 1 are the same direction. The vertical direction is a direction orthogonal to the rotational direction and the rotational axis direction of the photosensitive drum 1, and is also a direction orthogonal to the surface of the photosensitive drum 1. In other words, in the present embodiment, the first flow passage 50c of the second duct 50 extends in the rotational axis direction of the photosensitive drum 1, and the second flow passage 50d extends in a direction (first direction) orthogonal to the rotational direction and the rotational axis direction of the photosensitive drum 1.

A vortex of air is likely to occur at a portion where the cross-sectional shape of the second duct 50 changes, such as the inlet 50a and the outlet 50b of the second duct 50. Therefore, even if the air is taken in from the inlet 50a of the second duct 50 at an even flow velocity, the flow velocity of the air coming out from the outlet 50b is uneven, and the air is likely to flow backward. Even in a case where the air flow passage is bent as in the first flow passage 50c and the second flow passage 50d of the second duct 50, the airflow is likely to be disturbed, the flow velocity of the air coming out from the outlet 50b is uneven, and the air is likely to flow backward.

Therefore, in order to suppress backflow of air near the outlet 50b of the second duct 50, a plurality of flow dividing plates 60 is provided in the second flow passage 50d of the second duct 50. The plurality of flow dividing plates 60 is provided in parallel along the front-rear direction of the image forming apparatus A, that is, the rotational axis direction (second direction) of the photosensitive drum 1, at a position between the inner walls 50e and 50f of the second duct 50. The flow dividing plate 60 is a plate-like member extending in the vertical direction, and distributes and flows the air taken in from the inlet 50a of the second duct 50 toward the outlet 50b. In the present embodiment, since the second duct 50 is provided with 53 flow dividing plates 60, the air taken in from the inlet 50a of the second duct 50 is distributed to 54 flow passages toward the outlet 50b by the 53 flow dividing plates 60.

Figure 7:
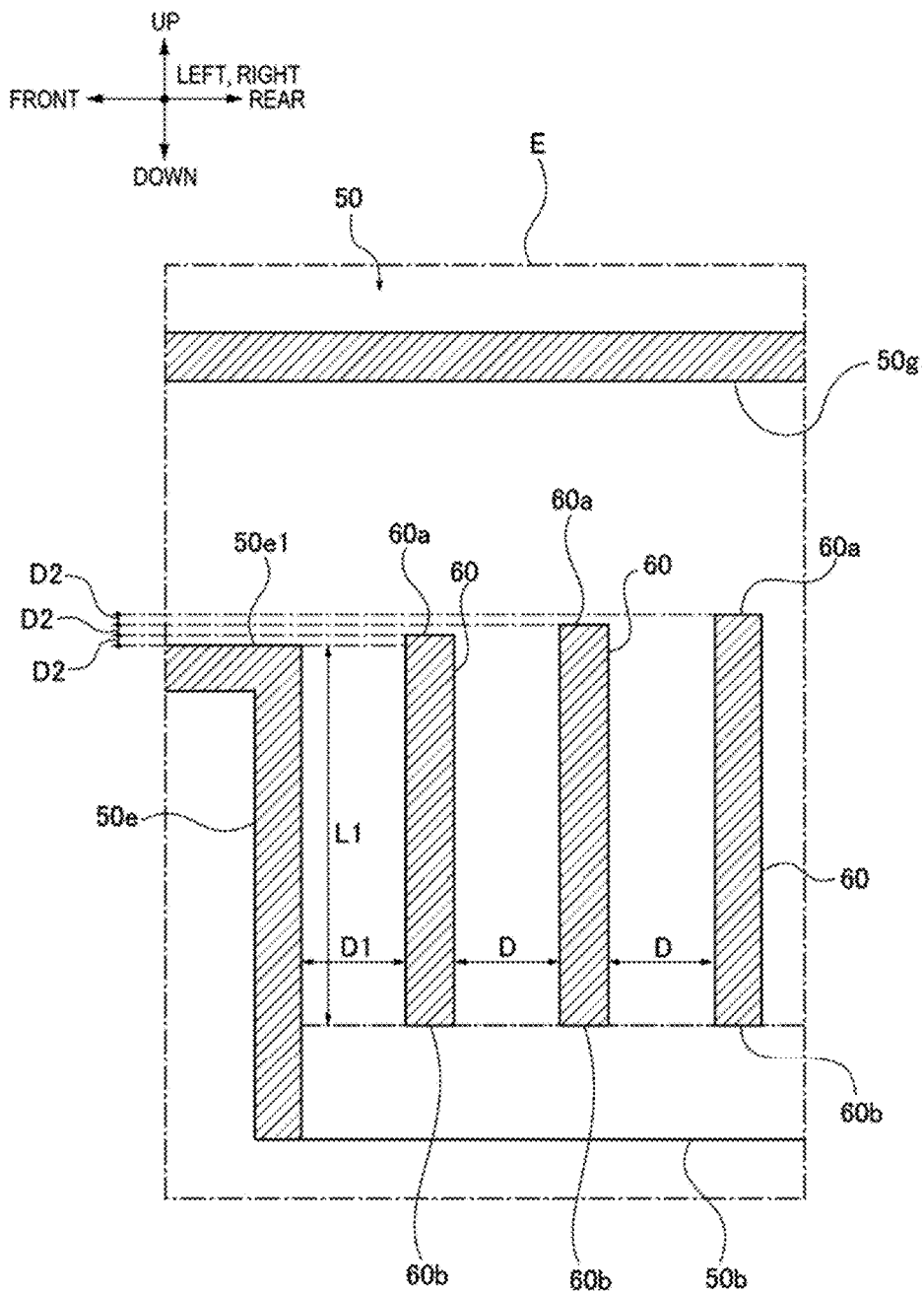
FIG. 7 is an enlarged view of a region E.

FIG. 7 is an enlarged view of a region E illustrated in FIG. 6. As illustrated in FIG. 7, the plurality of flow dividing plates 60 is arranged in parallel in the front-rear direction of the image forming apparatus A, that is, in the direction in which the first flow passage 50c extends, and is disposed at equal intervals between adjacent flow dividing plates 60. A lower end portion 60b of each of the plurality of flow dividing plates 60 is located at an equal position in the vertical direction. Thus, aligning the positions of the lower end portions 60b of the plurality of flow dividing plates 60 allows the air divided by the plurality of flow dividing plates 60 to be less likely to be diffused and to be less likely to be disturbed. The above effect can be obtained even if the position in the vertical direction of the lower end portion 60b of each of the plurality of flow dividing plates 60 is deviated within the range of tolerance.

The plurality of flow dividing plates 60 is disposed such that the positions of the upper end portions 60a of flow dividing plates 60 adjacent in the front-rear direction of the image forming apparatus A are deviated by distances D2 in the vertical direction. Of the two adjacent flow dividing plates 60, the upper end portion 60a of the flow dividing plate 60 closer to the inner wall 50e of the second duct 50 is disposed at a position closer to the outlet 50b than the upper end portion 60a of the flow dividing plate 60 closer to the inner wall 50f of the second duct 50. In other words, the plurality of flow dividing plates 60 is disposed such that the positions of the upper end portions 60a are raised stepwise by the distances D2 from the flow dividing plate 60 disposed at a position closest to the inner wall 50e toward the flow dividing plate 60 disposed at a position closest to the inner wall 50f.

Among the plurality of flow dividing plates 60, the flow dividing plate 60 disposed at a position closest to the inner wall 50e of the second duct 50 forms an air flow passage between the flow dividing plate and the inner wall 50e of the second duct 50. The air taken in from the inlet 50a of the second duct 50 is then divided (distributed) into air flowing through the air flow passage and air flowing through the inner wall 50f side of the second duct 50 rather than the air flow passage. The ratio of the vertical distance between the upper end portion 50e1 of the inner wall 50e of the second duct 50 and the upper end portion 60a of the flow dividing plate 60 disposed at a position closest to the inner wall 50e to the vertical distance between the inner wall 50g of the top surface of the second duct 50 and the upper end portion 60a of the flow dividing plate 60 disposed at a position closest to the inner wall 50e is 1:53. Therefore, the flow dividing plate 60 disposed at a position closest to the inner wall 50e of the second duct 50 divides the air so that the ratio of the amount of air flowing through the air flow passage formed between the flow dividing plate and the inner wall 50e to the amount of air flowing through the inner wall 50f side of the second duct 50 rather than the air flow passage is 1:53.

Among the plurality of flow dividing plates 60, the flow dividing plate 60 disposed at a position second closest to the inner wall 50e of the second duct 50 forms an air flow passage (third flow passage) between the flow dividing plate and the flow dividing plate 60 disposed at a position closest to the inner wall 50e. The air taken in from the inlet 50a of the second duct 50 is then divided into air flowing through the air flow passage, air flowing through the inner wall 50e side of the second duct 50 rather than the air flow passage, and air flowing through the inner wall 50f side of the second duct 50 rather than the air flow passage. The ratio of the vertical distance between the upper end portion 50e1 of the inner wall 50e of the second duct 50 and the upper end portion 60a of the flow dividing plate 60 disposed at a position second closest to the inner wall 50e to the vertical distance between the inner wall 50g of the top surface of the second duct 50 and the upper end portion 60a of the flow dividing plate 60 disposed at a position second closest to the inner wall 50e is 1:52. Therefore, the flow dividing plate 60 disposed at a position second closest to the inner wall 50e of the second duct 50 divides air so that the ratio of the amount of air flowing through the air flow passage formed between the flow dividing plate and the flow dividing plate 60 closest to the inner wall 50e to the amount of air flowing through the inner wall 50f side of the second duct 50 rather than the air flow passage is 1:52.

Among the plurality of flow dividing plates 60, the flow dividing plate 60 disposed at the third closest position from the inner wall 50e of the second duct 50 and the other flow dividing plates 60 other than the flow dividing plates disposed at the closest, the second closest and the third closest positions also have the same configuration as the flow dividing plate 60 disposed at the closest position to the inner wall 50e and the flow dividing plate 60 disposed at the second closest position. Such a configuration allows substantially the same amount of air to flow from the air flow passage formed by the plurality of flow dividing plates 60.

Since three or more flow dividing plates 60 are provided, a plurality of air flow passages (third flow passages) formed by the flow dividing plates 60 adjacent to each other is provided. As described above, since the plurality of flow dividing plates 60 is arranged at equal intervals in the front-rear direction of the image forming apparatus A, the length of each of the plurality of air flow passages formed by the flow dividing plates 60 adjacent to each other in the front-rear direction of the image forming apparatus A is configured to be equal as a length D. In the present embodiment, a length D1 in the front-rear direction of the image forming apparatus A of the air flow passage, which is formed between the flow dividing plate 60 disposed at a position closest to the inner wall 50e of the second duct 50 and the inner wall 50e of the second duct 50, is also equal to the length D. The length in the front-rear direction of the image forming apparatus A of the air flow passage, which is formed between the flow dividing plate 60 disposed at a position closest to the inner wall 50f of the second duct 50 and the inner wall 50f of the second duct 50, is also equal to the length D. Such a configuration allows the average flow velocity of the air flowing through the air flow passage formed by the plurality of flow dividing plates 60 to be substantially the same.

<Countermeasures Against Backflow Near Outlet of Air Flow Passage Formed Between Flow Dividing Plates>

As described above, the air flowing into the air flow passage formed by the flow dividing plates 60 adjacent to each other generates a vortex. If the length in the vertical direction of the flow dividing plate 60 is shorter than the size of the vortex, the backflow component of the vortex comes out of the flow dividing plate 60. In this case, there is a possibility that the air flows backward near the outlet of the air flow passage to cause a pressure loss, and that the rectifying function of the flow dividing plate 60 is deteriorated. Since the flow dividing plate 60 is provided near the outlet 50b of the second duct 50, if air flows backward near the outlet of the air flow passage formed by the flow dividing plate 60, air may flow backward near the outlet 50b of the second duct 50. If air flows backward near the outlet 50b of the second duct 50, there is a concern that an ozone product may flow backward together with the air flowing backward, and the capability of removing the ozone product may be reduced. Therefore, in the present embodiment, defining the lengths of the air flow passages formed by the flow dividing plates 60 adjacent to each other suppresses the backflow of air near the outlet of the air flow passage and the backflow of air near the outlet 50b of the second duct 50. The suppression of backflow will be described in detail below.

Figure 8:
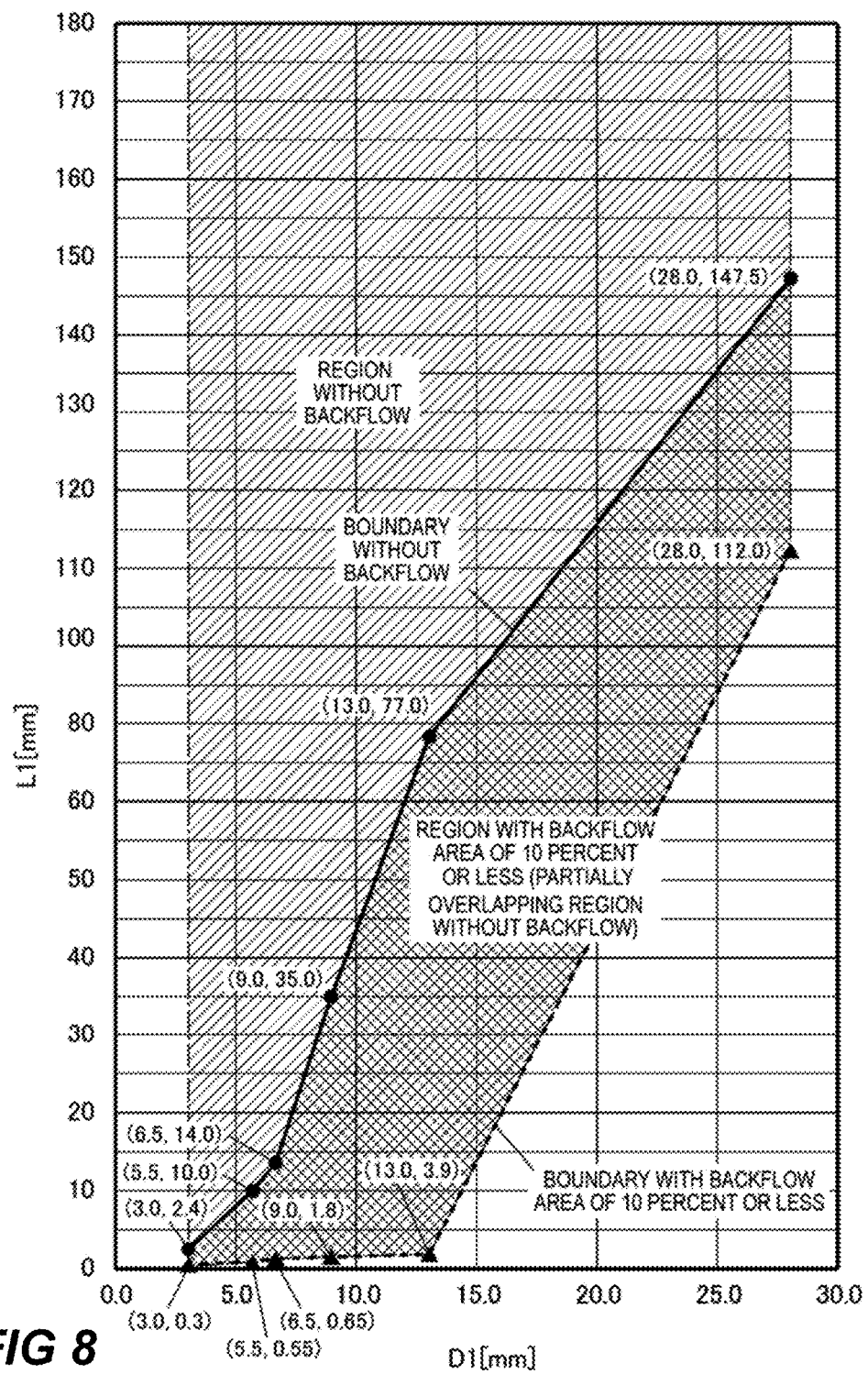
FIG. 8 is a graph illustrating a range in which backflow of air does not occur near an outlet of the second duct.

FIG. 8 is a graph illustrating a result obtained by computer simulation of a range in which backflow of air does not occur at the outlet 50b by changing the length in each direction of the air flow passage formed between the inner wall 50e of the second duct 50 and the flow dividing plate 60 disposed at a position closest to the inner wall 50e. In this simulation, the length L1 in the vertical direction of the air flow passage formed between the inner wall 50e of the second duct 50 and the flow dividing plate 60 disposed at a position closest to the inner wall 50e was changed in the range of 3.0 mm to 28 mm, and L1/D1 was changed in the range of 0.1 to 6 to perform measurements. Air having an even flow velocity flowing from the front to the rear of the image forming apparatus A was fed from the inlet 50a of the second duct 50, and the flow velocity of the air was measured on the projection surface of the outlet 50b, which was 20 mm away from the outlet 50b in the vertical direction. The length in the vertical direction of the inlet 50a of the second duct 50 was set to 40 mm, the length of the outlet 50b in the front-rear direction of the image forming apparatus A was set to 300 mm, the flow velocity of air near the inlet 50a was changed in the range of 5 m/s to 20 m/s, and an inner dimension D4 (FIG. 5) of the second duct 50 was changed in the range of 10 mm to 30 mm to perform measurements. The inner dimension D4 of the second duct 50 is an inner dimension in the left-right direction of the image forming apparatus A in the second duct 50, and the areas of the inlet 50a and the outlet 50b also change as the inner dimension D4 changes.

The plots on the graph illustrated in FIG. 8 indicate the conditions of the lower limit of the range in which no backflow occurs near the outlet 50b, or the lower limit of the range in which the area of the portion where backflow occurs is 10 percent or less of the area of the outlet 50b, with respect to the lengths L1 and D1 of the air flow passage. As illustrated in FIG. 8, as a result of the simulation, it was found that the backflow of air near the outlet 50b can be suppressed by defining the lengths L1 and D1 of the air flow passage to satisfy the following conditions.

If $3.0 \leq D1 \leq 5.5, L1 \geq D1 \times 3.04-6.72$

If $5.5 \leq D1 \leq 6.5, L1 \geq D1 \times 4.0-12.0$

If $6.5 \leq D1 \leq 9.0, L1 \geq D1 \times 8.40-40.60$

If $9.0 \leq D1 \leq 13.0, L1 \geq D1 \times 10.50-59.50$

If $13.0 \leq D1 \leq 28.0, L1 \geq D1 \times 4.70+15.90$

The above simulation is a simulation of the air flow passage formed by the inner wall 50e of the second duct 50 and the flow dividing plate 60 disposed at a position closest to the inner wall 50e. However, as described above, in terms of the width in the front-rear direction of the image forming apparatus A, the air flow passage formed by the inner wall 50e of the second duct 50 and the flow dividing plate 60 disposed at the position closest to the inner wall 50e is equal to the air flow passage formed by two flow dividing plates 60 adjacent to each other. The length in the vertical direction of the air flow passage formed by two flow dividing plates 60 adjacent to each other is longer than the length in the vertical direction of the air flow passage formed by the inner wall 50e of the second duct 50 and the flow dividing plate 60 disposed at a position closest to the inner wall 50e. Therefore, this simulation result can also be applied to the air flow passage formed by two flow dividing plates 60 adjacent to each other. In other words, the length in the vertical direction of the air flow passage formed by two flow dividing plates 60 adjacent to each other is L, and the length in the front-rear direction of the image forming apparatus A is D. In this case, defining the lengths L and D so as to satisfy the following conditions can suppress the backflow of air near the outlet 50b of the second duct 50.

If $3.0 \leq D \leq 5.5, L \geq D \times 3.04-6.72$

If $5.5 \leq D \leq 6.5, L \geq D \times 4.0-12.0$

If $6.5 \leq D \leq 9.0, L \geq D \times 8.40-40.60$

If $9.0 \leq D \leq 13.0, L \geq D \times 10.50-59.50$

If $13.0 \leq D \leq 28.0, L \geq D \times 4.70+15.90$

In the present embodiment, the air flow passage formed by two flow dividing plates 60 adjacent to each other means a region sandwiched between two flow dividing plates 60 adjacent to each other. In other words, the length in the vertical direction of the air flow passage formed by the closest flow dividing plate 60 and the second closest flow dividing plate 60 from the inner wall 50e of the second duct 50 means the length of L1+D2 illustrated in FIG. 7. The length in the vertical direction of the air flow passage formed by the second closest flow dividing plate 60 and the third closest flow dividing plate 60 from the inner wall 50e of the second duct 50 means the length of L1+D2+D2 illustrated in FIG. 7.

Figure 9:
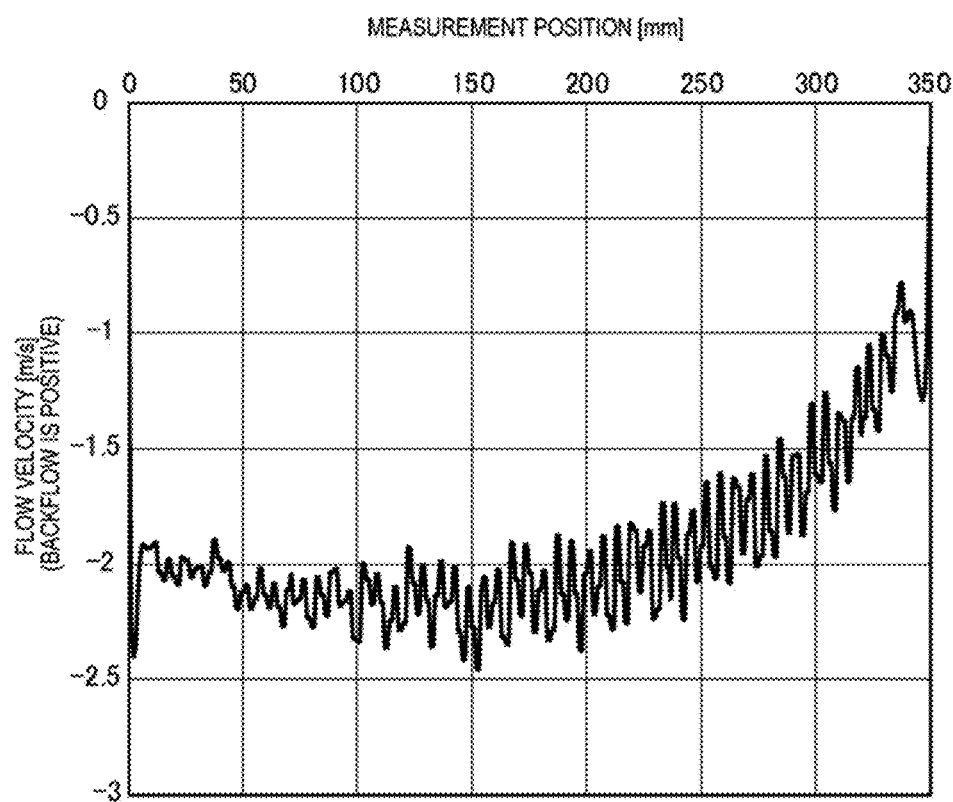
FIG. 9 is a graph illustrating a flow velocity distribution of air near the outlet of the second duct.

FIG. 9 is a graph illustrating a result obtained by computer simulation of a flow velocity distribution of air in the front-rear direction of the image forming apparatus A at a position 2 mm away from the outlet 50b in the vertical direction when air having a flow velocity of 20 m/s is introduced from the inlet 50a in the second duct 50. The vertical axis represents the flow velocity of air at the measurement position, and backflow is a positive value. The horizontal axis represents the measurement position, and the measurement position in the front-rear direction of the image forming apparatus A is set to the position of the inner wall 50e as a reference (0), and the measurement position is deviated to the rear of the image forming apparatus A as the numerical value increases. In the second duct 50 of the present embodiment, L1 is 16 mm, D1 is 4.5 mm, D2 is 0.415 mm, and the distance in the vertical direction from the lower end portion 60b of the flow dividing plate 60 to the outlet 50b is 17 mm.

As illustrated in FIG. 9, it was confirmed that the flow velocity of air at the measurement position was within a range of approximately −1 to −2.5 m/s and backflow was suppressed. The suppression of backflow is because the length L in the vertical direction of the air flow passage formed by two flow dividing plates 60 adjacent to each other and the length D in the front-rear direction of the image forming apparatus A are set so as to satisfy the above conditions. Thus, the configuration of the present embodiment can suppress the backflow of air near the outlet 50b of the second duct 50 by defining the length in each direction of the air flow passage formed by two flow dividing plates 60 adjacent to each other. Therefore, the configuration can suppress a reduction in the capability of removing ozone products due to the ozone product flowing backward together with the air flowing backward.

As described above, in the front-rear direction of the image forming apparatus A, the length of the space surrounded by the front block 2a, the rear block 2b, and the shield plate 2c in the charging device 2 is 10 percent larger than the maximum image forming region of the photosensitive drum 1. Accordingly, the length in the front-rear direction of the image forming apparatus A at the outlet 50b of the second duct 50, that is, the length in the longitudinal direction of the outlet 50b, is also 10 percent larger than the maximum image forming region of the photosensitive drum 1. Therefore, the backflow of air is allowed outside the maximum image forming region of about 10 percent of the area of the outlet 50b.

Figure 10:
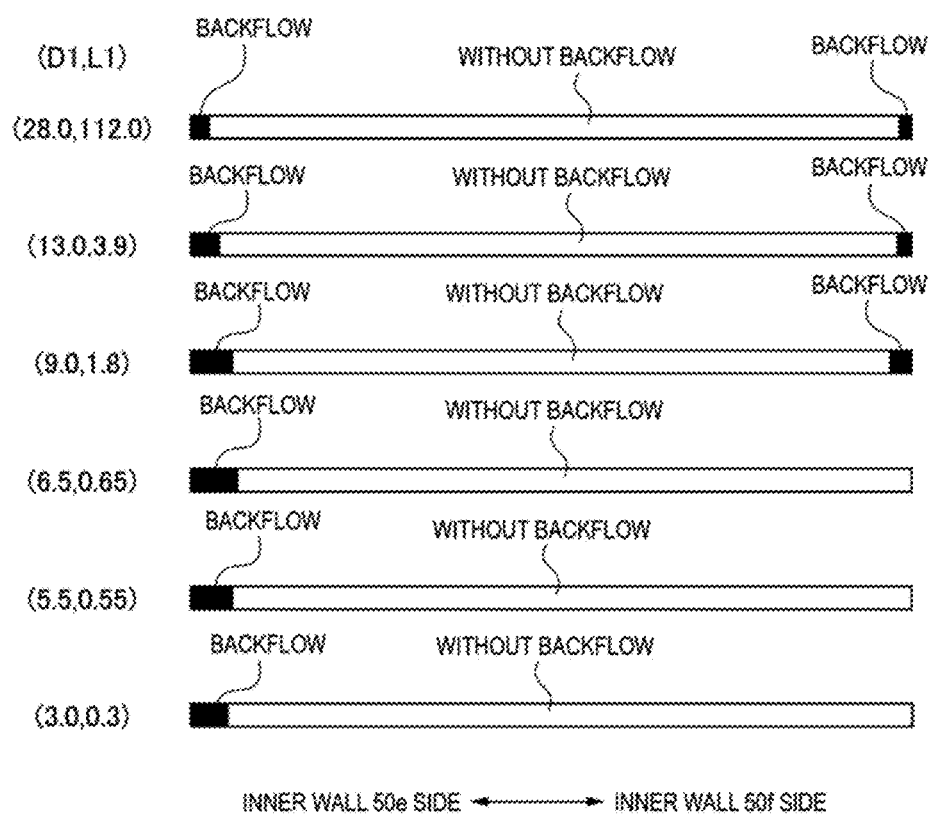
FIG. 10 is a diagram schematically illustrating a backflow range of air under a plot condition at a critical point at which an area of a portion where air flows backward is 10 percent or less of the outlet area of the second duct.

FIG. 10 is a diagram schematically illustrating a backflow range of air under a plot condition at a critical point at which an area of a portion where air flows backward is 10 percent or less of the area of the outlet 50b of the second duct 50. This backflow range is obtained by a simulation whose results are illustrated in FIG. 8. As illustrated in FIG. 10, the portion of the outlet 50b of the second duct 50 where the air flows backward is limited to the vicinity of the end portion in the longitudinal direction of the outlet 50b under any plot condition, and is outside the image forming region of the photosensitive drum 1. Therefore, from the graph illustrated in FIG. 8, defining the lengths L and D so as to satisfy the following conditions can suppress the backflow of air in the image forming region of the photosensitive drum 1.

If $3.0 \leq L \leq 5.5, L \geq D \times 0.1$

If $5.5 \leq L \leq 6.5, L \geq D \times 0.1$

If $6.5 \leq L \leq 9.0, L \geq D \times 0.46 - 2.34$

If $9.0 \leq L \leq 13.0, L \geq D \times 0.53 - 2.93$

If $13.0 \leq L \leq 28.0, L \geq D \times 7.21 - 89.79$

Second Embodiment

A configuration of an image forming apparatus according to a second embodiment of the present invention will then be described. The same portions as those of the first embodiment are denoted by the same reference numerals, and description thereof will be omitted.

Figure 11A:
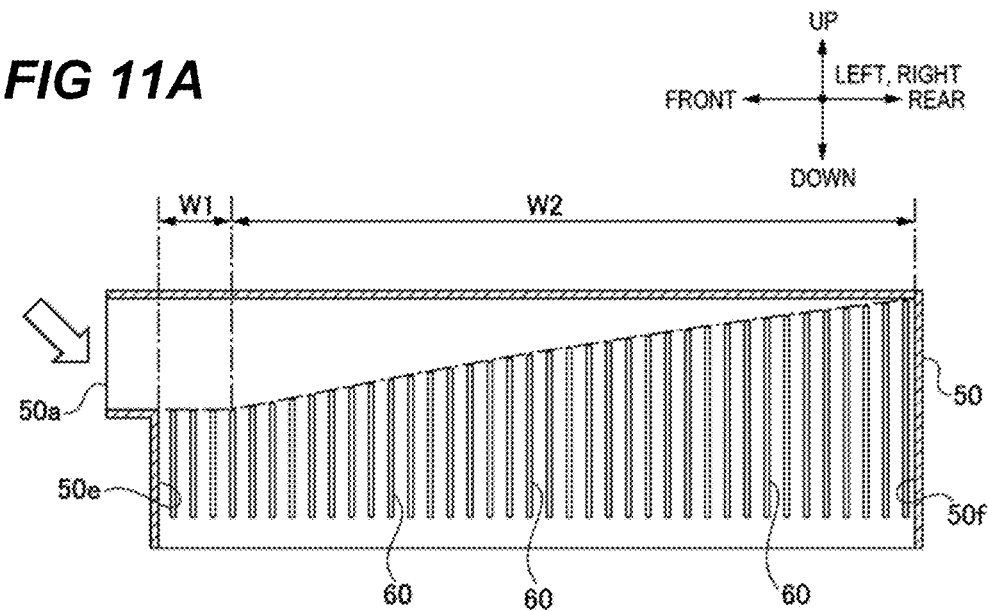
FIGS. 11A and 11B are schematic cross-sectional views of the second duct.
Figure 11B:
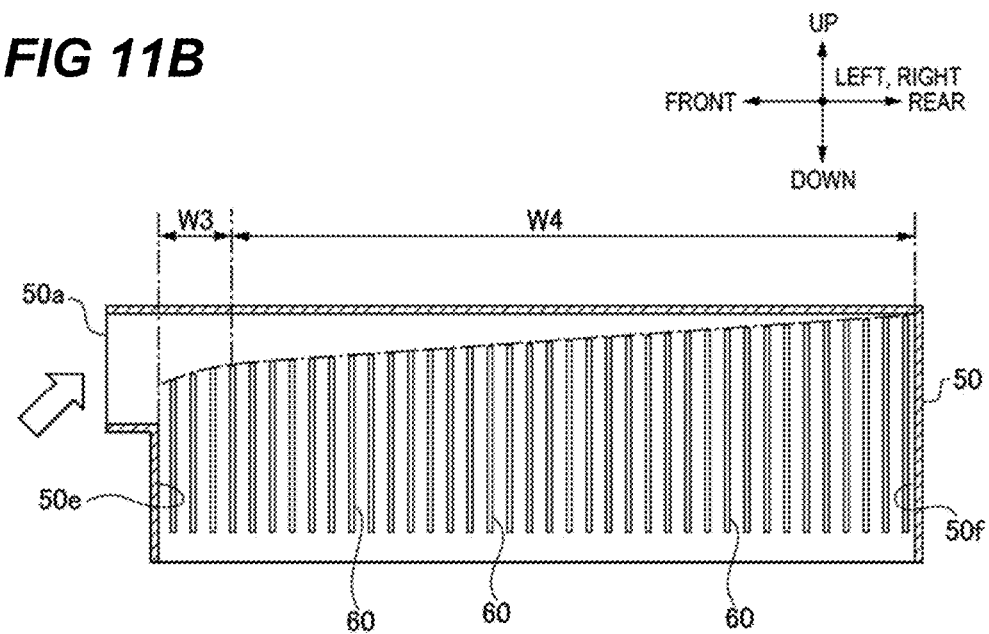

FIGS. 11A and 11B are schematic cross-sectional views of the second duct 50 according to the present embodiment. As illustrated in FIGS. 11A and 11B, the image forming apparatus A according to the present embodiment has a configuration different from that of the first embodiment in the direction in which air flows near the inlet 50a of the second duct 50 and the length in the vertical direction of the flow dividing plate 60, and other configurations of the present embodiment are the same as those of the first embodiment.

Specifically, as indicated by an arrow in FIG. 11A, when the direction of the airflow near the inlet 50a of the second duct 50 is 45 degrees obliquely downward, the profile V1 connecting the upper end portions 60a of the plurality of flow dividing plates 60 has the following shape. In other words, the shape has a downward inclination in the range of the W1 and an upward inclination in the range of the W2, which are illustrated in FIG. 11A. The shape is because the airflow illustrated in FIG. 11A has large components directed downward in the vertical direction, and air easily enters the flow passage in the range of W1 close to the inner wall 50e among the air flow passages formed by the plurality of flow dividing plates 60, so that the position of the upper end portion 60a of the flow dividing plate 60 is lowered to make the entry of air difficult. The shape is also because air hardly enters the flow passage in the range of W2 close to the inner wall 50f among the flow passages respectively formed by the plurality of flow dividing plates 60, so that the position of the upper end portion 60a of the flow dividing plate 60 is raised to facilitate the entry of air.

On the other hand, as indicated by an arrow in FIG. 11B, when the direction of the airflow near the inlet 50a of the second duct 50 is 45 degrees obliquely upward, the profile V2 connecting the upper end portions 60a of the plurality of flow dividing plates 60 has the following shape. In other words, the shape has a large upward inclination in the range of W3 and a small upward inclination compared to that of the range of W3 in the range of W4, which are illustrated in FIG. 11B. The shape is because the airflow illustrated in FIG. 11B has large components directed upward in the vertical direction, and air hardly enters the flow passage in the range of W3 close to the inner wall 50e among the air flow passages formed by the plurality of flow dividing plates 60, so that the position of the upper end portion 60a of the flow dividing plate 60 is raised to facilitate the entry of air. Further, among the flow passages respectively formed by the plurality of flow dividing plates 60, in the flow passage in the range of W4 close to the inner wall 50f, the components of the airflow in the front-rear direction become large and air easily enters the flow passage, so that the amount of air entering the air flow passage is adjusted by reducing the inclination of raising the position of the upper end portion 60a of the flow dividing plate 60.

In any of the configurations illustrated in FIGS. 11A and 11B, the following conditions are satisfied when the length in the vertical direction of the air flow passage formed by two flow dividing plates 60 adjacent to each other is L and the length in the front-rear direction of the image forming apparatus A is D.

If $3.0 \leq D \leq 5.5, L \geq D \times 3.04 - 6.72$

If $5.5 \leq D \leq 6.5, L \geq D \times 4.0 - 12.0$

If $6.5 \leq D \leq 9.0, L \geq D \times 8.40 - 40.60$

If $9.0 \leq D \leq 13.0, L \geq D \times 10.50 - 59.50$

If $13.0 \leq D \leq 28.0, L \geq D \times 4.70 + 15.90$

FIGS. 12A, 12B, 12C and 12D are graphs illustrating a result obtained by computer simulation of a flow velocity distribution of air in the front-rear direction of the image forming apparatus A at a position 2 mm away from the outlet 50b in the vertical direction when air having a flow velocity of 5 m/s is introduced from the inlet 50a in the second duct 50. The vertical axes of the graphs illustrated in FIGS. 12A, 12B, 12C and 12D represent the flow velocity of air at the measurement position, and backflow is a positive value. The horizontal axis represents the measurement position, and the measurement position in the front-rear direction of the image forming apparatus A is set to the position of the inner wall 50e as a reference (0), and the measurement position is deviated to the rear of the image forming apparatus A as the numerical value increases.

Figure 12A:
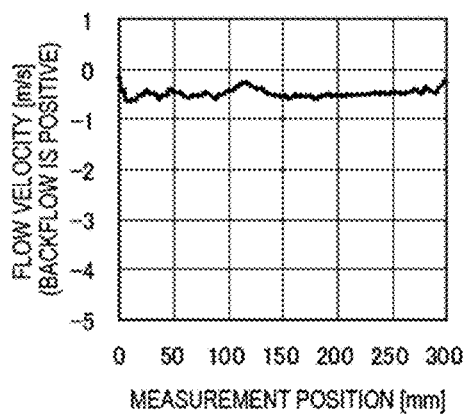
FIGS. 12A, 12B, 12C and 12D are graphs illustrating a flow velocity distribution of air near the outlet of the second duct.
Figure 12C:
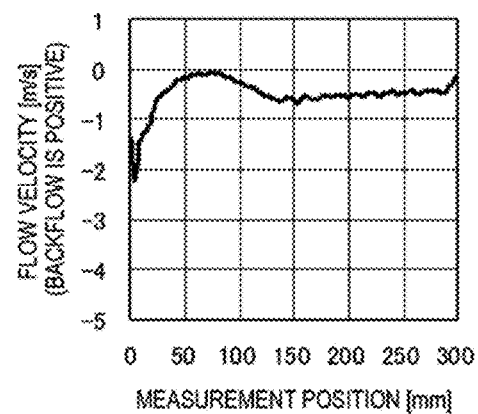
Figure 12B:
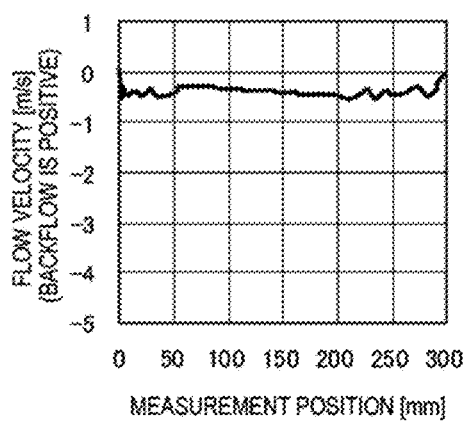
Figure 12D:
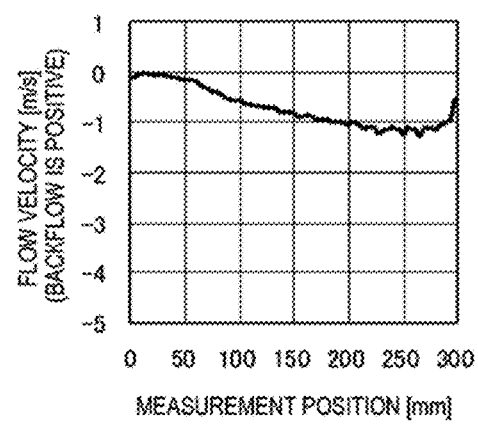

The graph illustrated in FIG. 12A illustrates a simulation result of the second duct 50 illustrated in FIG. 11A. The graph illustrated in FIG. 12B illustrates a simulation result of the second duct 50 illustrated in FIG. 11B. The graph illustrated in FIG. 12C illustrates a simulation result when the direction of the airflow near the inlet in the second duct 50 according to the first embodiment is the direction illustrated in FIG. 11A. The graph illustrated in FIG. 12D illustrates a simulation result when the direction of the airflow near the inlet in the second duct 50 according to the first embodiment is the direction illustrated in FIG. 11B.

As illustrated in FIGS. 12A, 12B, 12C and 12D, the occurrence of backflow is suppressed in any of the configurations. The suppression of backflow is because the length L in the vertical direction of the air flow passage formed by two flow dividing plates 60 adjacent to each other and the length D in the front-rear direction of the image forming apparatus A are defined so as to satisfy the above-described conditions. In the configuration of the present embodiment, the flow velocity distribution near the outlet 50b is made even compared to the configuration of the first embodiment.

Thus, the configuration of the present embodiment can suppress the backflow of air near the outlet 50b of the second duct 50 by defining the length in each direction of the air flow passage formed by two flow dividing plates 60 adjacent to each other.

The flow velocity distribution of air near the outlet 50b of the second duct 50 can be made even.

Third Embodiment

A configuration of an image forming apparatus according to a third embodiment of the present invention will then be described. The same portions as those of the first and second embodiments are denoted by the same reference numerals, and description thereof will be omitted.

FIG. 13 is a schematic cross-sectional view of the second duct 50 according to the present embodiment. As illustrated in FIG. 13, the configuration of the present embodiment differs from the configuration of the first embodiment in the length of the air flow passage formed by the flow dividing plate 60 of the second duct 50. Other configurations of the image forming apparatus A of the present embodiment are the same as those of the first embodiment.

Specifically, among the plurality of flow dividing plates 60, in the flow dividing plates 60 on the inner wall 50e side from the central portion of the second flow passage 50d, the length in the front-rear direction of the image forming apparatus A of the air flow passage formed by the flow dividing plates 60 adjacent to each other is a length D5. The length D5 is equal to the length D1. On the other hand, in the flow dividing plates 60 on the inner wall 50f side from the central portion of the second flow passage 50d, the length in the front-rear direction of the image forming apparatus A of the air flow passage formed by the flow dividing plates 60 adjacent to each other is a length D6 that is 1.7 times as long as the length D5.

Among the plurality of flow dividing plates 60, in the flow dividing plates 60 on the inner wall 50e side from the central portion of the second flow passage 50d, the lengths of the flow dividing plates 60 are set such that the positions of the upper end portions 60a of the flow dividing plates 60 adjacent to each other are deviated by distances D7 in the vertical direction. The distance D7 is equal to the distance D2. Among the plurality of flow dividing plates 60, in the flow dividing plates 60 on the inner wall 50f side from the central portion of the second flow passage 50d, the lengths of the flow dividing plates 60 are set such that the positions of the upper end portions 60a of the flow dividing plates 60 adjacent to each other are deviated by distances D8, which are 1.7 times as long as the distance D7, in the vertical direction. In other words, the plurality of flow dividing plates 60 has a shape that satisfies D5/D7=D6/D8.

Such a configuration allows the amount of air flowing through the air flow passage formed between flow dividing plates 60 adjacent to each other on the inner wall 50f side from the central portion of the second flow passage 50d to be 1.7 times the amount of air flowing through the air flow passage formed between flow dividing plates 60 adjacent to each other in the flow dividing plate 60 on the inner wall 50e side from the central portion, and the average flow velocity of air to be the same in all the air flow passages.

Also in the present embodiment, the following conditions are satisfied when the length in the vertical direction of the air flow passage formed by two flow dividing plates 60 adjacent to each other is L and the length in the front-rear direction of the image forming apparatus A is D.

If $3.0 \le D \le 5.5, L \ge D \times 3.04 - 6.72$

If $5.5 \le D \le 6.5, L \ge D \times 4.0 - 12.0$

If $6.5 \le D \le 9.0, L \ge D \times 8.40 - 40.60$

If $9.0 \le D \le 13.0, L \ge D \times 10.50 - 59.50$

If $13.0 \le D \le 28.0, L \ge D \times 4.70 + 15.90$

Figure 14:
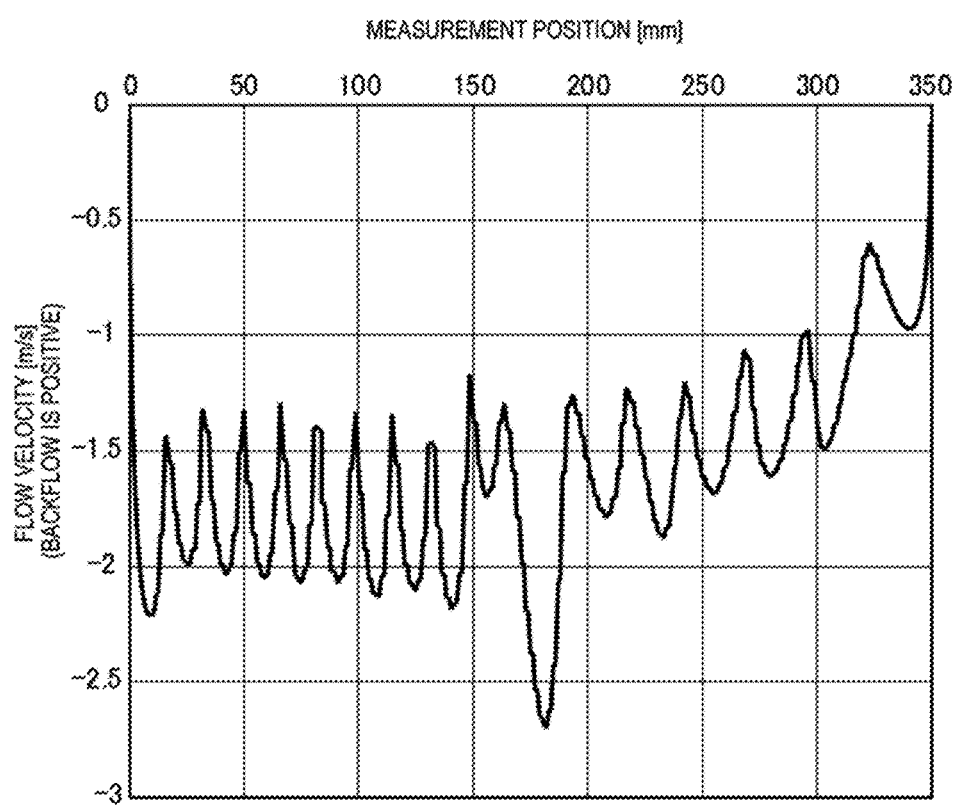
FIG. 14 is a graph illustrating a flow velocity distribution of air near the outlet of the second duct.

FIG. 14 is a graph illustrating a result obtained by computer simulation of a flow velocity distribution of air in the front-rear direction of the image forming apparatus A at a position 2 mm away from the outlet 50b in the vertical direction when air having a flow velocity of 20 m/s is introduced from the inlet 50a in the second duct 50. The vertical axis of the graph illustrated in FIG. 14 represents the flow velocity of air at the measurement position, and backflow is a positive value. The horizontal axis represents the measurement position, and the measurement position in the front-rear direction of the image forming apparatus A is set to the position of the inner wall 50e as a reference (0), and the measurement position is deviated to the rear of the image forming apparatus A as the numerical value increases.

As illustrated in FIG. 14, it was confirmed that the flow velocity of air at the measurement position was within a range of approximately −1 to −2.5 m/s and backflow was suppressed. The suppression of backflow is because the length L in the vertical direction of the air flow passage formed by two flow dividing plates 60 adjacent to each other and the length D in the front-rear direction of the image forming apparatus A are defined so as to satisfy the above-described conditions. Thus, the configuration of the present embodiment can suppress the backflow of air near the outlet 50b of the second duct 50 by defining the length in each direction of the air flow passage formed by two flow dividing plates 60 adjacent to each other.

In the present embodiment, there has been described a configuration in which the air flow passage formed by the flow dividing plates 60 adjacent to each other has two lengths D5 and D6 in the front-rear direction of the image forming apparatus A. However, the present invention is not limited to the above configuration, but may have a configuration that the lengths of each of the air flow passages are all set to different values with respect to the length D in the front-rear direction of the image forming apparatus A of the air flow passage formed by the flow dividing plates 60 adjacent to each other.

Fourth Embodiment

A configuration of an image forming apparatus according to a fourth embodiment of the present invention will then be described. The same portions as those of the first, second and third embodiments are denoted by the same reference numerals, and description thereof will be omitted.

Figure 15A:
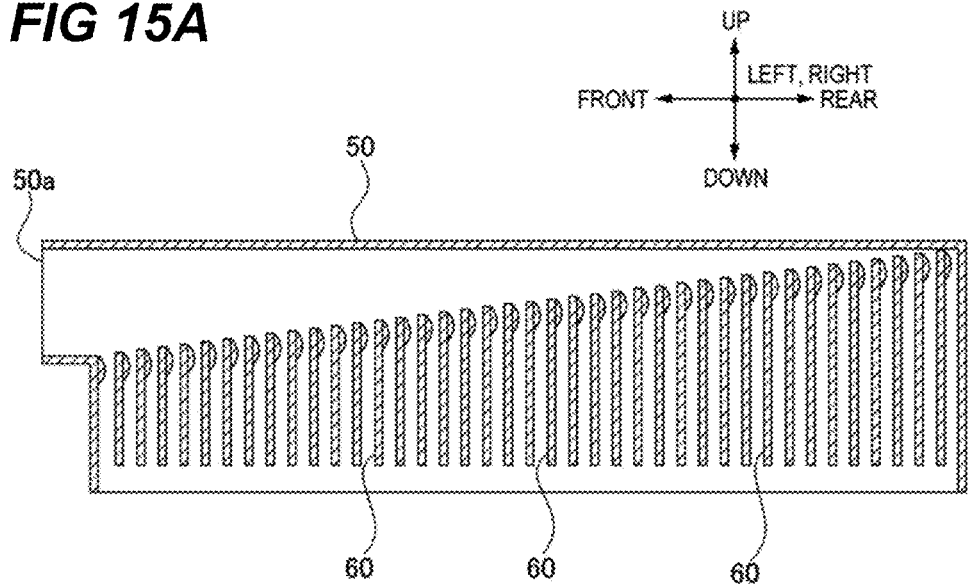
FIGS. 15A and 15B are schematic cross-sectional views of the second duct.
Figure 15B:
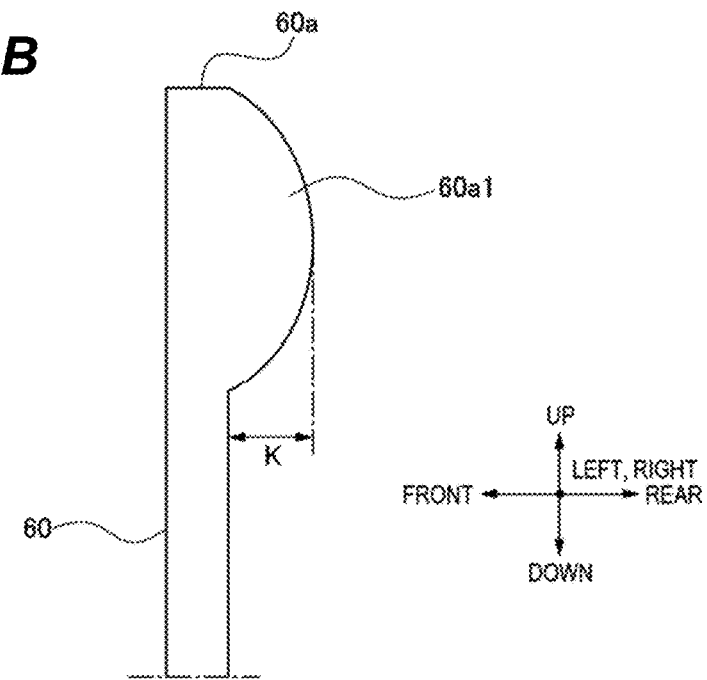

FIG. 15A is a schematic cross-sectional view of the second duct 50 according to the present embodiment. FIG. 15B is an enlarged view of the upper end portion 60a of the flow dividing plate 60 provided inside the second duct 50 according to the present embodiment. As illustrated in FIGS. 15A and 15B, the configuration of the present embodiment is different from the configuration of the first embodiment in the shape of the flow dividing plate 60. Specifically, an arc-shaped protrusion 60a1 is provided, in the upper end portion 60a of the plurality of flow dividing plates 60, which protrudes toward the downstream side in the traveling direction of air in the first flow passage 50c of the second duct 50, that is, toward the rear of the image forming apparatus A. The protrusion amount of the protrusion 60a1 is K.

In the second duct 50 according to the present embodiment, the inlet 50a is a rectangular opening of 30 mm×40 mm, and the outlet 50b is a rectangular opening of 30 mm×300 mm. The total number of flow dividing plates 60 is 39. Also in the present embodiment, the following conditions are satisfied when the length in the vertical direction of the air flow passage formed by two flow dividing plates 60 adjacent to each other is L and the length in the front-rear direction of the image forming apparatus A is D. Other configurations of the image forming apparatus A according to the fourth embodiment are the same as those of the first embodiment.

If $3.0 \leq D \leq 5.5, L \geq D \times 3.04 - 6.72$

If $5.5 \leq D \leq 6.5, L \geq D \times 4.0 - 12.0$

If $6.5 \leq D \leq 9.0, L \geq D \times 8.40 - 40.60$

If $9.0 \leq D \leq 13.0, L \geq D \times 10.50 - 59.50$

If $13.0 \leq D \leq 28.0, L \geq D \times 4.70 + 15.90$

Figure 16:
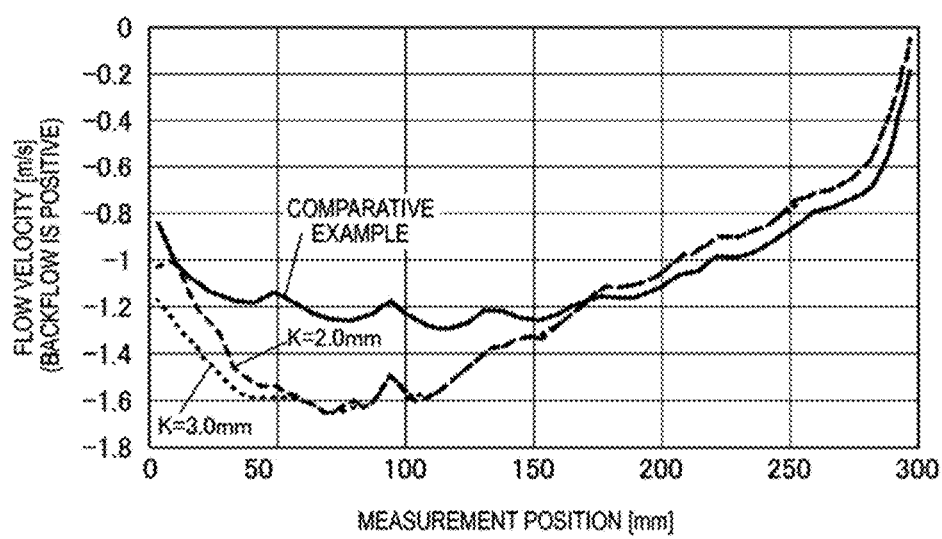
FIG. 16 is a graph illustrating a flow velocity distribution of air near the outlet of the second duct.

FIG. 16 is a graph illustrating a result obtained by computer simulation of a flow velocity distribution of air in the front-rear direction of the image forming apparatus A at a position 19 mm away from the outlet 50b in the vertical direction when air simulating the pressure and air volume characteristics (PQ characteristics) of a commercial fan is introduced from the inlet 50a in the second duct 50 according to the present embodiment. FIG. 16 illustrates simulation results of a configuration in which the protrusion amount K of the protrusion 60a1 of the flow dividing plate 60 is K=2, a configuration in which the protrusion amount K is K=3, and a configuration of a comparative example in which the protrusion 60a1 is not provided in the flow dividing plate 60. The vertical axis of the graph illustrated in FIG. 16 represents the flow velocity of air at the measurement position, and backflow is a positive value. The horizontal axis represents the measurement position, and the measurement position in the front-rear direction of the image forming apparatus A is set to the position of the inner wall 50e as a reference (0), and the measurement position is deviated to the rear of the image forming apparatus A as the numerical value increases.

As illustrated in FIG. 16, it was confirmed that the flow velocity of air at the measurement position was within a range of approximately −1 to −2.5 m/s and backflow was suppressed. The suppression of backflow is because the length L in the vertical direction of the air flow passage formed by two flow dividing plates 60 adjacent to each other and the length D in the front-rear direction of the image forming apparatus A are defined so as to satisfy the above-described conditions.

Figure 17:
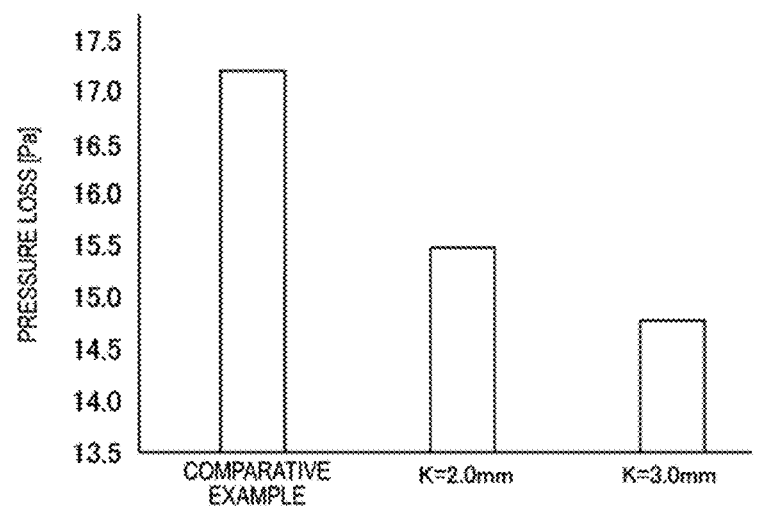
FIG. 17 is a graph illustrating a pressure loss of air near the outlet of the second duct.
Figure 18:
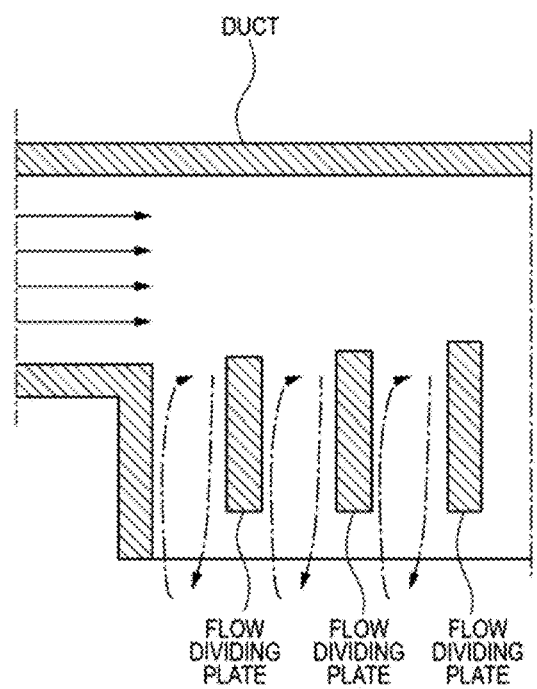
FIG. 18 is a schematic view of a conventional duct.

FIG. 17 is a graph illustrating results obtained by computer simulation of a pressure loss of air at a position 19 mm away from the outlet 50b in the vertical direction when air simulating the pressure and air volume characteristics (PQ characteristics) of a commercial fan is introduced from the inlet 50a in the second duct 50 according to the present embodiment. FIG. 17 illustrates simulation results of a configuration in which the protrusion amount K of the protrusion 60a1 of the flow dividing plate 60 is K=2, a configuration in which the protrusion amount K is K=3, and a configuration of a comparative example in which the protrusion 60a1 is not provided in the flow dividing plate 60.

As illustrated in FIG. 17, in the configuration of the present embodiment, the pressure loss of air is reduced compared to the configuration of the comparative example. In the configuration in which the protrusion amount K of the protrusion 60a1 of the flow dividing plate 60 is long, the pressure loss of air is reduced compared to the configuration in which the protrusion amount K is short. The reduction of pressure loss is considered to be due to the following reasons. In other words, in the case where there is no protrusion 60a1 in the upper end portion 60a of the flow dividing plate 60, separation of flow occurs in a region on the downstream side of the upper end portion 60a of the flow dividing plate 60 (substantially the same as the region in which the protrusion 60a1 of the present embodiment is present), and loss occurs due to flow disturbance or vortex generation. On the other hand, in a case where there is a protrusion 60a1 as in the present embodiment, it is considered that separation of flow is less likely to occur due to the presence of the protrusion 60a1 when air is introduced between flow dividing plates 60, thereby suppressing flow disturbance or vortex generation.

Thus, the configuration of the present embodiment can suppress the backflow of air near the outlet 50b of the second duct 50 by defining the length in each direction of the air flow passage formed by two flow dividing plates 60 adjacent to each other. The pressure loss of air near the outlet 50b of the second duct 50 can be reduced.

In the first to fourth embodiments, although the configuration for suppressing the backflow of air near the outlet 50b of the second duct 50 has been described, the same configuration can be applied to other ducts provided in the image forming apparatus A. For example, the configuration may be a plurality of flow dividing plates 60 similar to those of the second duct 50 provided inside the first duct 32. Thus, the backflow of air near the outlet of the first duct 32 is suppressed, and the cooling capacity of the sheet S in the double-sided conveying passage 26 can be suppressed from lowering. In this case, the first direction is the thickness direction of the sheet S on the double-sided conveying passage 26, and the second direction is the conveying direction of the sheet S on the double-sided conveying passage 26.

The present invention can suppress, in an image forming apparatus including a duct provided with a plurality of flow dividing plates, backflow of air near an outlet of the duct.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application No. 2021-029633, filed Feb. 26, 2021, which is hereby incorporated by reference herein in its entirety.

What is claimed is:

1. An image forming apparatus comprising:
    a duct configured to guide air outside the image forming apparatus to a cooling target; and
    a fan configured to generate an airflow for taking air outside the image forming apparatus into the duct, wherein
    the duct includes:
    a first flow passage;
    a second flow passage bent from the first flow passage and extending in a first direction, the second flow passage being provided with an outlet of the duct; and
    a plurality of flow dividing plates provided in the second flow passage, the plurality of flow dividing plates being disposed in parallel along a second direction orthogonal to the first direction and forming a third flow passage between the flow dividing plates adjacent to each other, and
    when a length in the first direction of the third flow passage is L (mm) and a length in the second direction of the third flow passage is D (mm), the L satisfies following conditions:

if $3.0 \leq D \leq 5.5, L \geq D \times 3.04 - 6.72$;

if $5.5 \leq D \leq 6.5, L \geq D \times 4.0 - 12.0$;

if $6.5 \leq D \leq 9.0, L \geq D \times 8.40 - 40.60$;

if $9.0 \leq D \leq 13.0, L \geq D \times 10.50 - 59.50$; and if $13.0 \leq D \leq 28.0, L \geq D \times 4.70 + 15.90$.

2. The image forming apparatus according to claim 1, wherein the outlet of the duct is disposed at a position within 17 mm from an end portion on a downstream side of the plurality of flow dividing plates in a direction in which air in the duct is directed toward the outlet.

3. The image forming apparatus according to claim 1, wherein in the first direction, an end portion on a side close to the outlet in each of the plurality of flow dividing plates is located at an equal position.

4. The image forming apparatus according to claim 1, wherein the duct is provided with a plurality of the third flow passages, and a length in the second direction of each of the plurality of the third flow passages is not equal.

5. The image forming apparatus according to claim 1, wherein the duct is provided with a plurality of the third flow passages, and a length in the first direction of each of the plurality of the third flow passages is not equal.

6. The image forming apparatus according to claim 1, comprising:
    a photoreceptor; and
    a charging member which is the cooling target and charges a surface of the photoreceptor.

7. The image forming apparatus according to claim 1, comprising:
    a photoreceptor;
    a transfer device configured to transfer a toner image formed on the photoreceptor onto a sheet;
    a fixing device configured to fix the toner image transferred onto the sheet by the transfer device to the sheet; and
    a conveying device configured to convey the sheet having passed through the fixing device,
    wherein the duct guides air toward a sheet on a conveying path of the sheet conveyed by the conveying device.

8. The image forming apparatus according to claim 7, wherein
    the conveying path includes a reverse conveying path that reverses the sheet to which the toner image is fixed by the fixing device and conveys the sheet to a transfer portion in the transfer device, and
    the duct guides air toward the sheet on the reverse conveying path.

* * * * *